United States Patent
Wuidart et al.

(10) Patent No.: US 7,002,832 B2
(45) Date of Patent: Feb. 21, 2006

(54) ONE-TIME PROGRAMMING MULTIPLE-LEVEL MEMORY CELLS

(75) Inventors: Luc Wuidart, Pourrieres (FR); Michel Bardouillet, Rousset (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/694,317

(22) Filed: Oct. 27, 2003

(65) Prior Publication Data
US 2004/0085806 A1    May 6, 2004

(30) Foreign Application Priority Data
Oct. 31, 2002  (FR)  .................................. 02 13694

(51) Int. Cl.
G11C 17/00    (2006.01)
G11C 17/14    (2006.01)
G11C 11/56    (2006.01)
G11C 5/06     (2006.01)
G11C 17/18    (2006.01)

(52) U.S. Cl. ...................... 365/100; 365/159; 365/148; 365/71

(58) Field of Classification Search ................ 365/100, 365/94, 96, 185.03, 71, 159, 148
See application file for complete search history.

(56) References Cited

U.S. PATENT DOCUMENTS

| | | | |
|---|---|---|---|
| 4,146,902 A | 3/1979 | Tanimoto et al. | |
| 4,399,372 A | 8/1983 | Tanimoto et al. | |
| 4,559,637 A | 12/1985 | Weber | |
| 4,586,163 A | 4/1986 | Koike | |
| 5,187,559 A | 2/1993 | Isobe et al. | |
| 5,418,738 A | 5/1995 | Abadeer et al. | |
| 6,433,725 B1 | 8/2002 | Chen et al. | |
| 2002/0027793 A1 | 3/2002 | Johnson et al. | |

FOREIGN PATENT DOCUMENTS

DE    101 01 575 A1    7/2002

OTHER PUBLICATIONS

Kato K. et al. "A Physical Mechanism of Current-Induced Resistance Decrease In Heavily Doped Polysilicon Resistors" IEEE Transactions on Electron Devices, IEEE Inc. New York, US, vol. 29, No. 8, Aug. 1982, pp. 1156-1161.

Primary Examiner—Anh Phung
Assistant Examiner—J. H. Hur
(74) Attorney, Agent, or Firm—Lisa K. Jorgenson; James H. Morris; Wolf, Greenfield & Sacks, P.C.

(57) ABSTRACT

A multiple-level memory cell including a storage element formed of several polysilicon resistors connected in series between two input/output terminals; and a load in series with said resistive element, the midpoint of this series connection forming a read terminal of the memory cell, and the respective junction points of said resistors of the storage element being accessible.

10 Claims, 4 Drawing Sheets

ONE-TIME PROGRAMMING MULTIPLE-LEVEL MEMORY CELLS

BACKGROUND OF THE INVENTION

1. Field of the Invention

The present invention relates to one-time programming memory cells (OTP) and, more specifically, to such memory cells in which the storage element is formed by a resistive polysilicon element in an integrated circuit.

2. Discussion of the Related Art

The programmable resistive element is then in series with a programming switch, possibly also used as a cell selection switch, and the programming is performed in non-destructive fashion (conversely to a fusible element) by causing an irreversible decrease in the value of the resistive polysilicon element.

Figure 1:
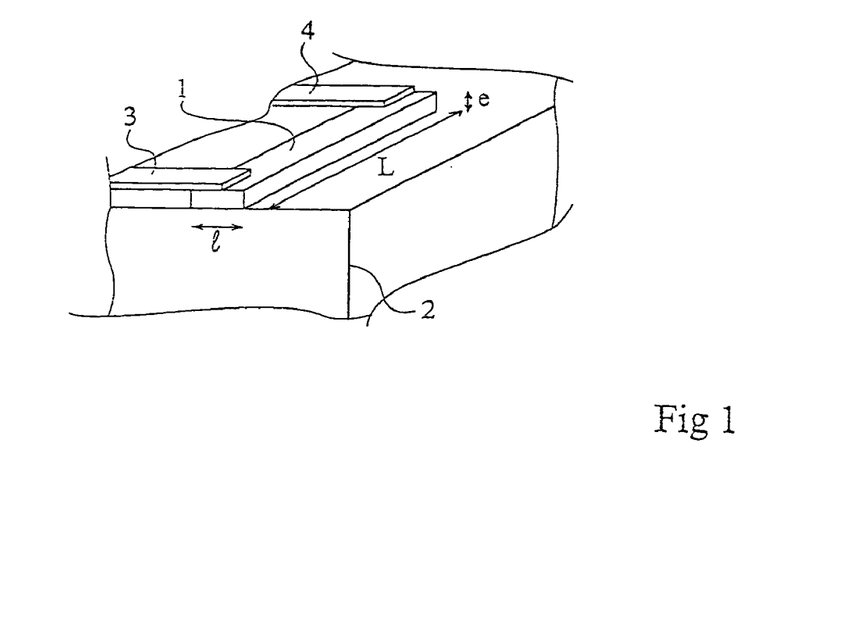
FIG. 1, previously described, partially and very schematically shows an example of a resistive polysilicon element of the type usable by the present invention.

FIG. 1 shows in a very simplified partial perspective view an example of a polysilicon resistor of the type used in a memory cell to which the present invention applies.

Such a resistor 1 is formed of a polysilicon track (also called a bar) obtained by etching of a layer deposited on an insulating substrate 2. Substrate 2 is indifferently formed of the integrated circuit substrate or is formed of an insulating layer forming an insulating substrate or the like for resistor 1. Resistor 1 is connected, by its two ends, to conductive tracks (for example, metal tracks) 3 and 4 intended to connect the resistive bar to the other integrated circuit elements according to the application. The simplified representation of FIG. 1 makes no reference to the different insulating and conductive layers generally forming the integrated circuit. To simplify, only resistive bar 1 laid on insulating substrate 2 and in contact, by the ends of its upper surface, with the two metal tracks 3 and 4, has been shown. In practice, the connections of resistive element 1 to the other integrated circuit components are obtained by wider polysilicon tracks starting from the ends of bar 1 in the alignment thereof. In other words, resistive element 1 is generally formed by making a section of a polysilicon track narrower than the rest of the track.

Resistance R of element 1 is given by the following formula:

$$R = \rho(L/s),$$

where $\rho$ designates the resistivity of the material (polysilicon, possibly doped) forming the track in which element 1 is etched, where L designates the length of element 1, and where s designates its section, that is, its width 1 multiplied by its thickness e. Resistivity $\rho$ of element 1 depends, among others, on the possible doping of the polysilicon forming it. In certain cases, the polysilicon element is covered with a metal layer, the resistive element then combining the polysilicon and the overlying metal.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 1, the resistance is thus given by the following relation:

$$R = R_\square * L/1.$$

Quotient L/1 corresponds to what is called the number of squares forming resistive element 1. This represents, as seen from above, the number of squares of given dimension depending on the technology put side by side to form element 1.

The value of the polysilicon resistor is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

In recent technologies, the use of polysilicon resistors is limited to resistors meant to be run through, in operation, by currents smaller than 100 μA. For greater currents, a diffusion resistor is generally used. Polysilicon is however preferred to a dopant diffusion, since the occurrence of stray capacitances with the substrate is avoided.

To irreversibly decrease the value of a polysilicon resistor, a so-called constraint current is temporarily imposed, for which the resistance crosses a maximum value, this current being beyond the normal operating current range of this resistance. In other words, the polysilicon resistivity in the operating current range is decreased, in stable and irreversible fashion, by imposing in the corresponding resistive element the flowing of a current beyond the operating current range.

The current used to decrease the resistance is, conversely to a fusible element, non-destructive for the polysilicon element.

Figure 2:
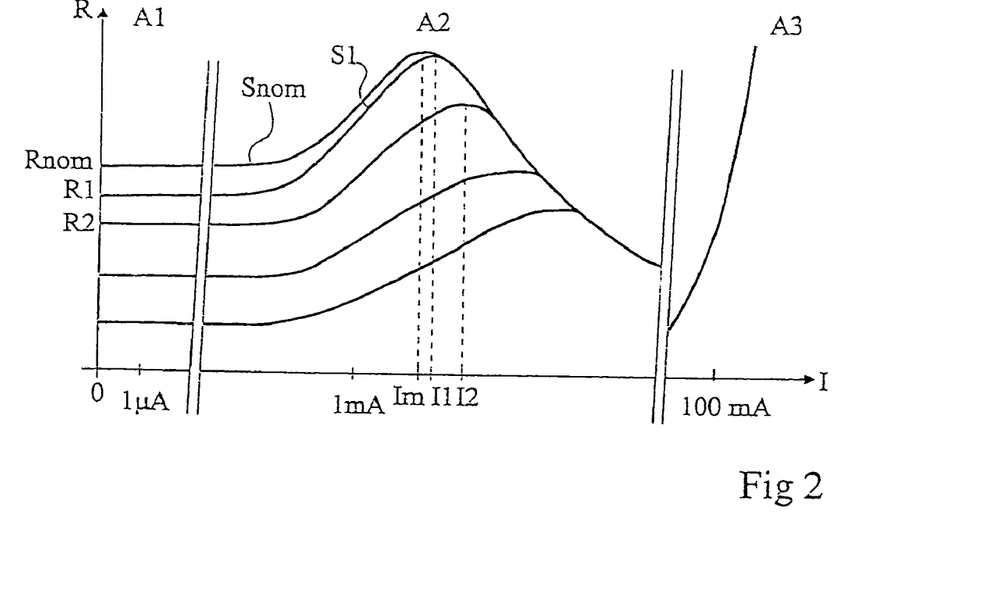
FIG. 2, previously described, illustrates, in a curve network representing the value of the resistance versus the current in a polysilicon element such as shown in FIG. 1, the implementation of an irreversible decrease in the value of this resistive element used by the present invention.

FIG. 2 illustrates, with a curve network giving the resistance of a polysilicon element of the type shown in FIG. 1 according to the current flowing therethrough, the way of decreasing the resistance of this element.

It is assumed that the polysilicon having been used to manufacture resistive element 1 exhibits a nominal resistivity giving element 1, for the given dimensions 1, L, and e, a resistance $R_{nom}$. This nominal (original) value of the resistance corresponds to the value taken in a stable manner by resistive element 1 in the operating current range of the system, that is, generally, for currents smaller than 100 μA.

To decrease the resistance and to switch in an irreversible and stable manner, for example, to a value R1 smaller than $R_{nom}$, a so-called constraint current (for example, I1), greater than a current Im for which the value of resistance R of element 1 is maximum without for all this being infinite, is imposed across resistive element 1. As illustrated in FIG. 2, once current I1 has been applied to resistive element 1, a stable resistance of value R1 is obtained in range A1 of operating currents of the integrated circuit. In fact, curve $S_{nom}$ of the resistance according to the current is stable for relatively low currents (smaller than 100 μA). This curve starts increasing for substantially higher currents on the order of a few milliamperes, or even more (range A2). In this current range, curve $S_{nom}$ crosses a maximum for value Im. The resistance then progressively decreases. In FIG. 2, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the resistance or more specifically the resistivity of the polysilicon element.

Indeed, once the maximum of curve $S_{nom}$ of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal read operating mode (range A1) of the integrated circuit, that is, outside of the normal resistor operation.

Once the value of the polysilicon resistor has been lowered to a lower value (for example, R1 in FIG. 2), an irreversible decrease in this value may further be implemented. It is enough, to achieve this, to exceed maximum current I1 of the new curve S1 of the resistance according to the current. For example, the current value may be increased to reach a value I2. When the current is then decreased again, a value R2 is obtained for the resistor in its normal operating range. The value of R2 is smaller than value R1 and, of course, than value $R_{nom}$.

It can be seen that all the curves of the resistance according to the current join on the decrease slope of the resistance value, after having crossed the maximum of the curve. Thus, for a given resistive element ($\rho$, L, s), currents I1, I2, etc. which must be reached, to switch to a smaller resistance value, are independent from the value of the resistance ($R_{nom}$, R1, R2) from which the decrease is caused.

What has been expressed hereabove as the resistance value actually corresponds to a decrease in the resistivity of the polysilicon forming the resistive element. The present inventors consider that the crystalline polysilicon structure is modified in a stable manner and that, in a way, the material is reflowed, the obtained final crystalline structure depending on the maximum current reached. In fact, the constraint current causes a temperature rise of the silicon element, which causes a flowing thereof.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere), which are not available once the circuit has been made.

The practical forming of a polysilicon resistor according to the present invention does not differ from the forming of a conventional resistor. Starting from an insulating substrate, a polysilicon layer is deposited and etched according to the dimensions desired for the resistor. Since the deposited polysilicon thickness is generally determined by technology, the two dimensions which can be adjusted are the width and the length. Generally, an insulator is redeposited on the polysilicon bar thus obtained. In the case of an on-line interconnection, width 1 will have been modified with respect to the wider access tracks to be more strongly conductive. In the case of an access to the ends of the bar from the top as shown in FIG. 1, vias will be made in the overlying insulator (not shown) of the polysilicon bar to connect contact metal tracks 3 and 4.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible polysilicon doping, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, several methods may be used.

For example, the current is progressively (step by step) increased in the resistor. After each application of a higher current, it is returned to the operating current range and the resistance value is measured. As long as current point Im has not been reached, this resistance value will remain at value $R_{nom}$. As soon as current point Im has been exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it essentially conditions the number of possible decreases. The higher the pitch, the higher the jumps between values will be.

According to another preferred example, the different currents to be applied to pass from the different resistance values to smaller values are predetermined, for example, by measurements. This predetermination of course takes into account the nature of the polysilicon used as well as, preferentially, the square resistance, that is, the resistivity of the material and the thickness with which it is deposited. Indeed, since the curves illustrated by FIG. 2 may also be read as the curves of the square resistance, the calculated values may be transposed to the different resistors of an integrated circuit defined by the widths and lengths of the resistive sections. According to this second embodiment, the value of the constraint current to be applied to the resistive element to decrease its value in an irreversible and stable manner can then be predetermined.

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, no additional duration of application of the constraint current modifies, at least at the first order, the obtained resistance. Moreover, even if in a specific application, it is considered that the influence of the duration of application of the constraint cannot be neglected, the two methods are perfectly compatible with the taking into account of the duration of application of the constraint.

The fact that the resistance value can be decreased several times with respect to its value just after manufacturing by successively applying larger and larger constraint currents can let envisage a multiple-level memory cell. Indeed, it may be provided to program several times (a finite number of times) a memory cell comprising a resistive element of the type described hereabove to decrease several times the value of this resistive element. By detecting the value differences of the resistive element (for example, by measuring the voltage thereacross while it is integrated in a resistive dividing bridge), it may be envisaged to form a multiple-level memory cell.

However, the reading of such a memory cell is particularly complex since the read amplifier must be capable of distinguishing the analog levels that cannot be easily predetermined.

Further, the application of various constraint currents to the resistive element according to the value which is desired to be programmed therein would be a very delicate operation. Indeed, the different current levels to be obtained lead to an analog implementation which is generally poorly compatible with the forming of an integrated circuit memory for which logic levels are essentially desired, at least for the control.

It would however be desirable to take advantage of the capacity of programming of polysilicon resistive elements by irreversible decrease in the value of their resistance, which is a particularly well adapted way of making the state programmed in a memory cell invisible (especially by optical observation).

SUMMARY OF THE INVENTION

The present invention aims at providing a one-time (or at least a limited number of times) programming multiple-level memory cell which is compatible with a programming control by means of logic signals.

The present invention also aims at providing such a memory cell in which the reading of the programmed state can be performed in a technology compatible with a logic technology.

The present invention also aims at providing a solution which does not require applying across the resistive element to be programmed, to apply a constraint current, a voltage greater than the memory cell operating voltage.

To achieve these and other objects, the present invention provides a multiple-level memory cell, comprising:

a storage element formed of several polysilicon resistors connected in series between two input/output terminals; and a load in series with said resistive element, the junction point thereof forming a read terminal of the memory cell, and the respective junction points between said resistors of the storage element being accessible.

According to an embodiment of the present invention, at least certain points among said junction points of the memorization element and the junction point of this element with the load, are connectable, individually by a switch, either to one of said input/output terminals of the storage element, or to a terminal of application of a predetermined voltage.

According to an embodiment of the present invention, the ends of a same resistor are not connectable to the same terminal.

According to an embodiment of the present invention, said switches are formed of MOS transistors distributed half and half between P-channel transistors and N-channel transistors.

According to an embodiment of the present invention, all polysilicon resistors have identical nominal values.

According to an embodiment of the present invention, the number of possible programmable levels corresponds, at most, to the number of polysilicon resistors of the storage element plus one.

According to an embodiment of the present invention, the programming is performed by imposing, in one or several of said polysilicon resistors of the storage element, a constraint current greater than a current for which the value of this resistance exhibits a maximum.

According to an embodiment of the present invention, said constraint current is beyond a read operating current range of the storage element.

The present invention also provides a circuit for reading from at least one memory cell, comprising an assembly of comparators respectively receiving, on a first input, the voltage at the input/output terminals of the memorization elements and, on a second input, a reference voltage chosen according to a level to be detected by the comparator from among the desired possible levels.

According to an embodiment of the present invention, the circuit comprises one less comparator than there are levels desired to be distinguished in the memory cell, and an assembly of logic gates generating as many states as there are comparators, the binary word provided by said assembly representing the state of the memory cell.

According to an embodiment of the present invention, the circuit comprises a number of comparators equal to twice the number of levels which are desired to be distinguished in the cell, the comparator outputs being combined two by two in the increasing order of the reference voltages that they receive, to detect one level per comparator pair.

The present invention also provides a method for programming a multiple-level memory cell.

The foregoing objects, features, and advantages of the present invention will be discussed in detail in the following non-limiting description of specific embodiments in connection with the accompanying drawings.

DETAILED DESCRIPTION

The same elements have been designated with the same reference numerals in the different drawings. For clarity, only those elements that are necessary to the understanding of the present invention have been shown in the drawings and will be described hereafter. In particular, the control circuits capable of appropriately selecting a memory cell from an array network have not been detailed. The present invention may be implemented with conventional line and/or column selection circuits or, at least, circuits, the adaptations of which are within the abilities of those skilled in the art based on the functional indications which will be given. Further, the practical forming of resistive polysilicon sections by deposition and etching has not been shown, the present invention being implementable by conventional manufacturing techniques. Preferably, the polysilicon forming the resistive elements of the present invention is not submitted to a metal deposition conventionally used to decrease the resistance of the MOS transistor gates.

A feature of the present invention is to provide a division of the resistive element forming the storage element of the memory cell into several resistors, which are made individually programmable by a switch network. The switch network is used to select one or several of the individual resistors which preferentially have identical nominal values, to program a predetermined value of the resistive element.

According to the present invention, the number of resistors forming a resistive element conditions the number of possible levels of the memory cell. Preferably, these levels are discrete levels in that the constraint current applied to a resistor to be programmed is predetermined and identical for all the resistors of the memory cell, and more generally for all resistors in a possibly array network of memory cells.

Figure 3:
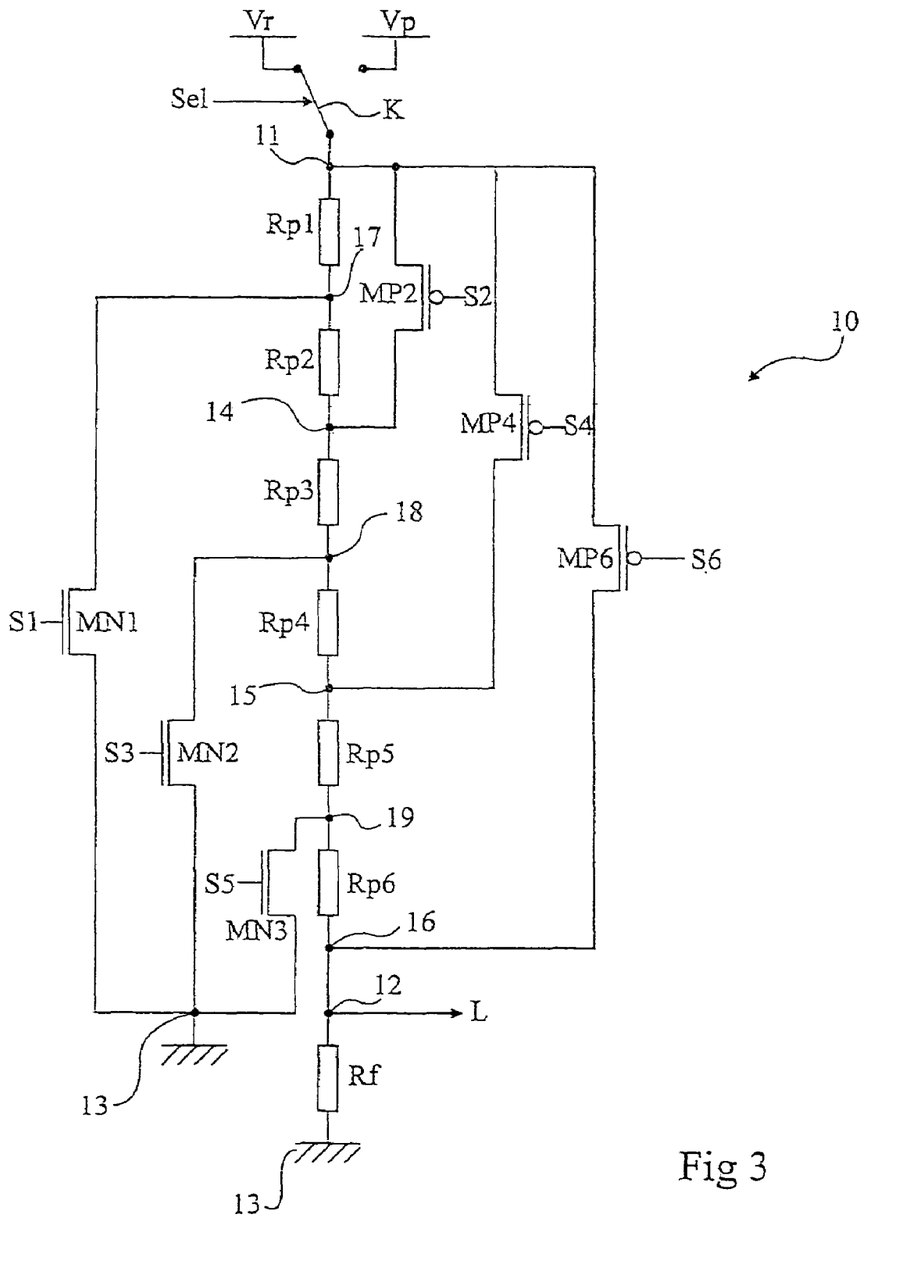
FIG. 3 shows a first embodiment of a one-time programming multiple-level memory cell according to the present invention.

FIG. 3 shows an embodiment of a memory cell 10 according to the present invention.

In the example shown in FIG. 3, the forming of a memory cell with seven predetermined level is assumed. The programmable resistive element is then formed of a series association of six resistors Rp1 to Rp6, each formed of a polysilicon section such as illustrated in FIG. 1. Resistors Rp1 to Rp6 are associated in series between two terminals 11 and 12 of the programmable resistive element. The value of this resistive element thus corresponds to the sum of the individual values of resistors Rp1 to Rp6. The level stored in the memory cell is read from one of these two terminals, for example, by means of a fixed resistor Rf forming a charge resistor enabling formation of a resistive dividing bridge having its midpoint 12 forming a read terminal. For such a reading, a voltage Vr is applied to the other terminal 11 of memory cell 10, preferably via a switch K operating as a switch for selecting the cell if said cell is associated in a column and/or in a line to other cells.

Switch K is conventionally controlled by a selection signal Sel. In the case of an association of several memory cells, charge resistor Rf may be shared by all the cells in a same column or row selectable by switch K. Further, this switch may be used when cell 10 is desired to be programmed to apply a different programming voltage Vp greater than voltage Vr, if necessary to cause the irreversible decreases in the values of resistances Rp1 to Rp6.

To ensure the programming of the resistive cell element, an individual selection of resistors Rp1 to Rp6 to be submitted to a constraint current to decrease their value is allowed. In a first example, reference will be made to the application of a programming voltage Vp, knowing that this programming voltage may, with some precautions, correspond to read voltage Vr, as will be explained hereafter.

In the example shown, it is provided to connect each of resistors Rp1 to Rp6 between terminal 11 and a terminal 13 of application of a reference voltage (for example, the ground to which is connected resistor Rf). This connection preferentially amounts to turning the series association of resistors Rp1 to Rp6 into a parallel association of these resistors between terminals 11 and 13. To select that of the programmable resistors to which the programming voltage is applied to decrease their respective values, six switches are provided (a number equal to the number of resistors). For example, three P-channel MOS transistors MP2, MP4, and MP6 connect terminal 11 to the respective junction points 14, 15, and 16 (the latter corresponding to terminal 12) of resistors Rp2 and Rp3, Rp4 and Rp5, Rp6 and Rf. Three N-channel MOS transistors MN1, MN2, and MN3 respectively connect junction points 17, 18, and 19 of resistors Rp1 and Rp2, Rp3 and Rp4, Rp5 and Rp6 to ground 13.

Resistors Rp1 to Rp6 preferentially have identical values or at least the same value as reference read resistors which will be described hereafter in relation with FIGS. 4 and 5.

To program the resistive element of cell 10 of FIG. 3 to one of the possible levels by irreversible decrease in the value of one or several of resistors Rp1 to Rp6, either this programming may be performed successively and individually for each of the involved resistors, or this decrease may be performed collectively according to a preferred embodiment of the present invention. For example, to apply programming voltage Vp to resistors Rp1, Rp2, and Rp3 simultaneously, transistors MN1, MP2, and MN2 are turned on. As a result, points 18 and 17 are at ground 13 while points 11 and 14 are at voltage Vp. Since transistors MP4 and MP6 are off (as well as, optionally, transistor MN3), voltage Vp is not applied to the other resistors Rp4 to Rp6. The generation of respective signals S1 to S6 of transistors MN1 to MP6 is performed by a circuit (not shown), the structure of which is within the abilities of those skilled in the art based on the indications given hereabove.

Figure 4:
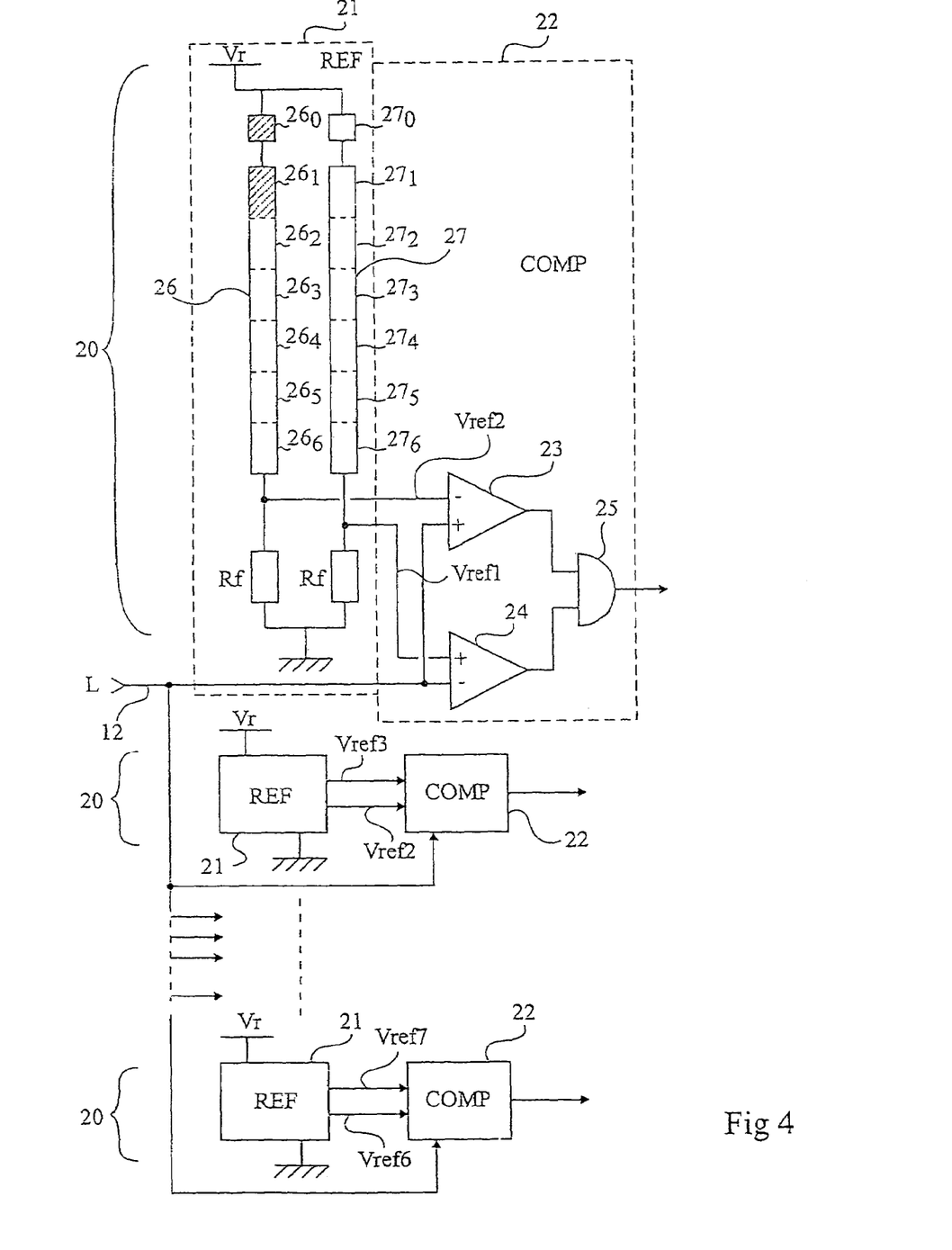
FIG. 4 shows a first embodiment of a sense amplifier of a memory cell or of a memory cell network such as illustrated in FIG. 3.

FIG. 4 shows a first embodiment of a circuit for reading from a memory cell 10 such as shown in FIG. 3. To simplify, the read circuit and its operation will be described assuming that it is intended to read a single cell 10 of FIG. 3. It should however be noted that such a circuit may be shared by several cells 10 arranged in an array network and selected by appropriate column and row decoding circuits. In FIG. 4, cell 10 has not been shown, and only its output terminal 12 intended for the read circuit has been shown.

A read circuit according to this embodiment preferably comprises one more stage 20 than cell 10 to be read comprises individually-programmable resistors, or more specifically as many stages as there are levels to be detected. Each stage is formed of a circuit 21 (REF) for generating reference voltages Vref1 and Vref2, Vref2 and Vref3, ..., Vref6 and Vref7, different from each other, and of a circuit 22 for comparing (COMP) these reference values with level L read from cell 10. Each comparison circuit comprises two comparators 23, 24, having inputs of opposite type (for example, respectively non-inverting and inverting) connected to terminal 12 and having their other respective inputs receiving the two reference voltages of the stage. In FIG. 4, a single stage 20 has been detailed. Arbitrarily, the first stage has been chosen.

The reference voltages are intended, for each stage, to detect how many resistors from among the Rp1 to Rp6 of cell 10 have been or not programmed by irreversible decrease in their value. According to a first embodiment, the higher reference voltage of each stage may correspond to the lower reference voltage of the next stage. In this case, the reference voltages are generated so that the read level L ranges between the two reference values with which it is compared if the involved stage is the stage conditioning the final level.

The respective outputs of comparators 23 and 24 of each circuit 22 are combined by a logic AND-type gate 25 having its output providing a binary state indicative of one of the levels that can be stored in cell 10.

In the example of FIG. 4, the reference voltage generation uses an embodiment using a structure identical to that of memory cells 10, that is, a same number of programmable resistors in series with a fixed resistor Rf of same value as that of cell 10. To simplify the description, the two programmable resistors 26 and 27 illustrated in FIG. 4 have been symbolized by a single resistor having six sections 261 to 266 and 271 to 276 corresponding to programmable resistors Rp1 to Rp6 of FIG. 3. The resistor switching transistors have not been illustrated in FIG. 4. Preferably, resistive elements 26 and 27 have the same structure as those shown in FIG. 3. In particular, if resistors Rp1 to Rp6 do not all have identical values, the resistors of same rank (1 to 6) of the cells 10 to be read from have the same values as those of reference resistive elements 26 and 27. Thus, by preprogramming resistive elements 26 and 27 of the different circuits 21, reference values respectively corresponding to the different possible levels for cell 10 are set. In FIG. 4, the fact that the value of resistor 261 has been decreased has been symbolized by hatching the corresponding section 261 of resistive element 26. Resistive element 27 is, as far as it is concerned, at its original value to guarantee that threshold Vref1 is at least equal to the programmed value.

Preferably, and as illustrated in FIG. 4, resistors $26_i$ and $27_i$ (i here varying between 1 and 6) all have the same values, the programmed value of which corresponds, for example, to half the unprogrammed value. Further, additional resistive sections $26_0$ and $27_0$ are added in series with resistors 26 and 27, respectively. The values of these sections correspond, in an unprogrammed state, to the programmed value of the other sections and, in a programmed state, for example to half the programmed value of the other sections, that is, here to one quarter of the value of the other unprogrammed sections. Such an embodiment enables reusing the upper threshold of a stage 20 as the lower threshold of the next stage. Resistor $26_0$ (threshold Vref2) of the first stage is programmed while its resistor $27_0$ (threshold Vref1) is not. Afterwards, resistors $26_0$ and $27_0$ of each stage correspond to programmed values, which enables reusing the upper thresholds, with no modifications, as the lower thresholds of the next stages.

If only resistor Rp1 of a read memory cell 10 has been programmed by irreversible decrease in its value, the voltage at terminal 12 will be greater than reference voltage Vref1 but smaller than reference voltage Vref2. The respective outputs of comparators 23 and 24 will both be high and gate 25 will provide a high state. All the other stages 20 of the read circuit will provide low states since the thresholds are increasing and threshold Vref2 has not been reached. If none of the programmable resistors of cell 10 has been programmed by irreversible decrease in its value, all stages provide low states. If, conversely, all resistors have been programmed by irreversible decrease in their respective value, all stages provide a high state. It can thus be seen that the binary states provide by the different comparators 22 of the read circuit give an indication of the individual programming resistors Rp1 to Rp6 of the cell 10 read from, and thus of the level stored in this cell.

Taking as an example a relative value 1 for a resistor $26i$, the successive threshold values 5.75, 5.25, 4.75, 4.25, etc. are obtained. This enables proper detection of the states taken by the read value L, that is, 6, 5.5, 5, 4.5, etc.

Figure 5:
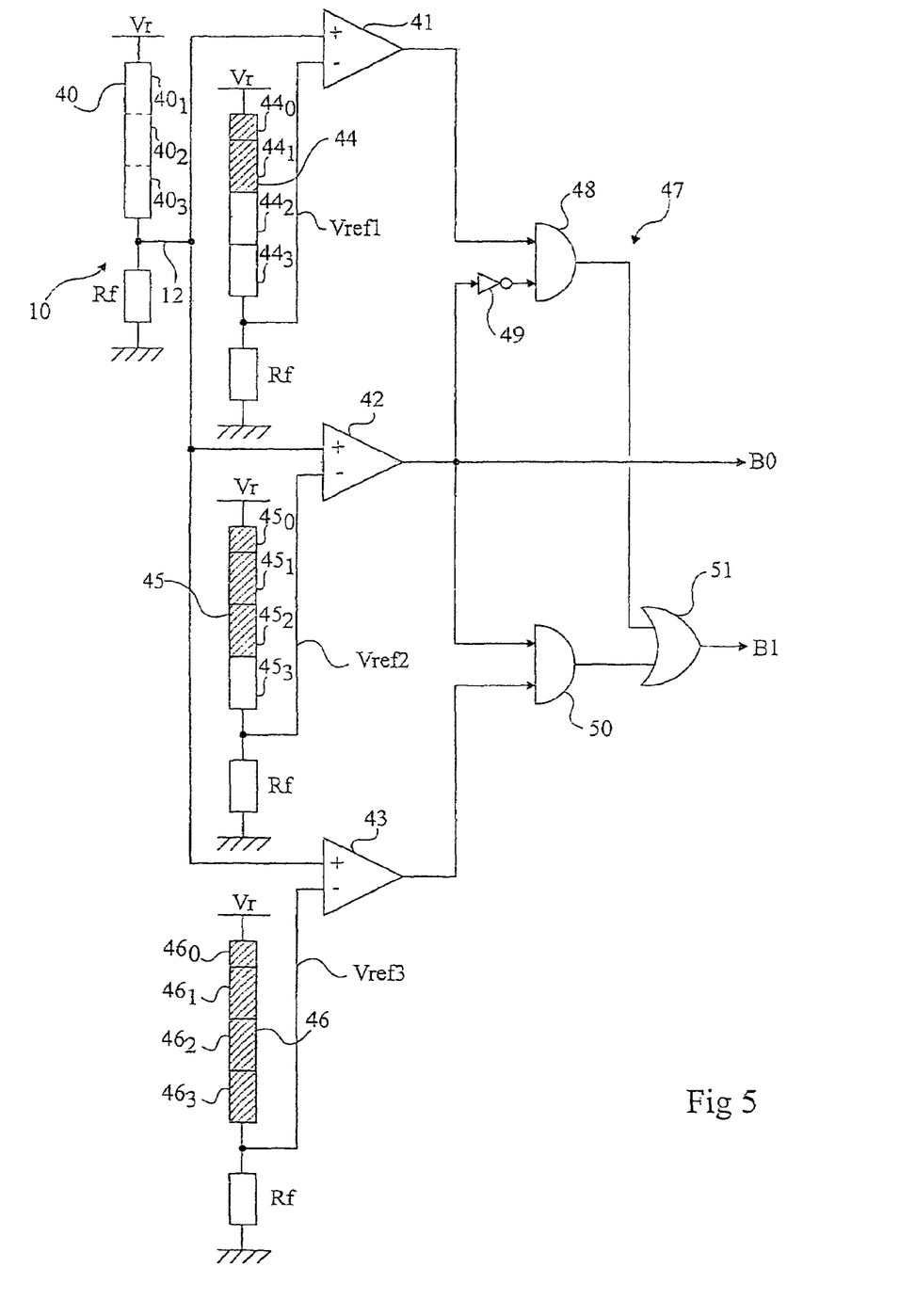
FIG. 5 shows a second embodiment of a sense amplifier of a memory cell or of a memory cell network such as illustrated in FIG. 3.

FIG. 5 shows a second embodiment of a circuit for reading from a memory cell or from a plurality of multiple-level memory cells according to the present invention. In FIG. 5, cell 10 has been schematized by a resistive element 40 with three sections 401, 402, and 403 in series with a fixed resistor Rf. It is however the same structure as that illustrated in FIG. 3, but here only containing three programmable resistors.

Cell read terminal 12 is connected to the respective non-inverting inputs of three comparators 41, 42, and 43 having their respective inverting inputs receiving reference voltages Vref1, Vref2, and Vref3 corresponding to the programmings of cell 10 on its first resistor 401, its two resistors 401 and 402 or its three resistors 401, 402, and 403, respectively.

According to a preferred embodiment, the reference voltages are generated, as for the previous read circuit, by means of resistive structures identical to those of the memories to be read from, to which are added sections corresponding to half the value taken by a programmed section of element 40. Thus, voltage Vref1 is generated by a resistive element 44, only the first programmable resistor 441 of which has been previously programmed by irreversible decrease in its value with a section 440 also programmed, but of half its value. Resistive element 44 is in series with a resistor Rf, their junction point being connected to the inverting input in amplifier 41. Voltage Vref2 is obtained by a resistive element 45 of which resistors 451 and 452 and a half-section 450 have been programmed and which is series connected with a resistor Rf, their junction point being connected to the inverting input of amplifier 42. Similarly, voltage Vref3 is obtained by a cell with a resistive element 46, the three first elements 461, 462, and 463 and a half-section 460 of which have been programmed.

Comparator 41 provides a high output state if the voltage read from the memory cell is greater than threshold Vref1. Respectively, amplifiers 42 and 43 provide high output states if the voltage read from memory cell 10 is greater than thresholds Vref2 and Vref3.

The outputs of comparators 41, 42, and 43 are exploited by a logic circuit 47 having the function of providing a reading of 4 levels on two respectively most significant and least significant bits B0 and B1. The output of comparator 42 directly provides the first most significant bit B0. The output of gate 41 is combined by an AND-type gate 48 with the inverse (inverter 49) of the output of gate 42. The output of comparator 42 is further combined by an AND-type gate 50 with the output of comparator 43. The respective outputs of gates 48 and 50 are combined by an OR-type gate 51 providing the least significant bit B1 of the word representing the level stored in cell 10.

It should be noted that the present invention may take as a basis a memory cell having a capacity (in number of levels, and thus of sections) greater than the number of exploited levels, the latter being set by the read circuit.

The resistors programmable by irreversible decrease in their value associated in series to form a memory cell according to the present invention may be in any number. This higher this number, the higher the number of detectable levels. The number of possible programmings of a cell according to the present invention depends, if a single programming voltage is used, on the number of possible cell levels. Indeed, since the value decrease is irreversible, the programming of a cell can only occur towards a global decrease in the value of its resistive storage element.

An advantage of the present invention is that the programming of a cell does not require selecting different programming voltages. The present invention is accordingly compatible with a programming order coming from a binary word controlling the different programming transistors MP1 to MP6 (FIG. 3).

Another advantage of the present invention is that the multiple-level memory cell thus formed is invisibly programmed, in that the programmed or unprogrammed state of the different resistors cannot be optically detected, conversely to fusible resistors.

It should be noted that the fact that the memory cell reading is performed while the resistors are in series may, in certain cases, allow use of one and the same voltage Vp to perform both the reading and the programming. It is enough for the value of resistor Rf to guarantee no programming of elements Rp1 to Rp6 (that is, that it absorbs enough current). In such a case, the connections of cell 10 will preferentially be inverted so that resistor Rf is connected to voltage Vp and the resistive element of the cell is connected between this resistor and the ground. This enables preserving, downstream, read amplifiers which operate under a relatively low voltage.

Of course, the present invention is likely to have various alterations, modifications, and improvements which will readily occur to those skilled in the art. In particular, the dimensions of the polysilicon resistors to obtain a given nominal value depend on the application and are within the abilities of those skilled in the art based on the functional indications given hereabove.

Further, other applications and control and read circuits than those discussed hereabove as an example may be envisaged.

Further, the number of controllable resistors Rp usable in a memory cell is not limited. They may even, if necessary, share a same control circuit (transistors MN1 to MP6) if the cell selection circuits enable individually isolating each of the memory cells.

Finally, although the control circuit is preferentially integrated with the memory cell, which eases the method implementation during the memory lifetime, it is not excluded to use a separate circuit to force the constraint current in the various resistors. On this regard, the voltage or current constraint values to implement the present invention are within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A multiple-level memory cell, comprising:
   a storage element formed of several polysilicon resistors connected in series between two input/output terminals;
   a load in series with said resistive element, the junction point thereof forming a read terminal of the memory cell, and the respective junctions between said resistors of the storage element being accessible; and
   wherein at least certain points among said junctions of the storage element and the junction of this element with the load, are connectable, individually by a switch, either to one of said input/output terminals of the storage element, or to a terminal of application of a predetermined voltage, wherein individual programming of the resistors may be performed.

2. The cell of claim 1, wherein the ends of a same resistor are not connectable to the same terminal.

3. The cell of claim 1, wherein said switches comprise MOS transistors distributed half and half between P-channel transistors and N-channel transistors.

4. The cell of claim 1, wherein all polysilicon resistors have identical nominal values.

5. The cell of claim 1, wherein the number of possible programmable levels corresponds, at most, to the number of polysilicon resistors of the storage element plus one.

6. The memory cell of claim 1, wherein the programming is performed by imposing, in one or several of said polysilicon resistors of the storage element, a constraint current greater than a current for which the value of this resistance exhibits a maximum.

7. The cell of claim 6, wherein said constraint current is beyond a read operating current range of the storage element.

8. A circuit for reading from at least one memory cell of claim 1, comprising an assembly of comparators respectively receiving, on a first input, the voltage at the input/output terminals of the storage elements and, on a second input, a reference voltage chosen according to a level to be detected by the comparator from among the desired possible levels.

9. The circuit of claim 8, comprising one comparator less than there are levels desired to be distinguished in the memory cell, and an assembly of logic gates generating as many states as there are comparators, the binary word provided by said assembly representing the state of the memory cell.

10. The circuit of claim 8, comprising a number of comparators equal to twice the number of levels which are desired to be distinguished in the cell, the comparator outputs being combined two by two in the increasing order of the reference voltages that they receive, to detect one level per comparator pair.

* * * * *